(12) United States Patent
Lin

(10) Patent No.: US 8,256,736 B2
(45) Date of Patent: Sep. 4, 2012

(54) MOUNTING RACK STRUCTURE AND MOUNTING HOLE ADAPTER THEREOF

(75) Inventor: Sheng-Huang Lin, Sinjhuang (TW)

(73) Assignee: Asia Vital Components Co., Ltd., Taipei County (TW)

( * ) Notice: Subject to any disclaimer, the term of this patent is extended or adjusted under 35 U.S.C. 154(b) by 480 days.

(21) Appl. No.: 12/536,502

(22) Filed: Aug. 6, 2009

(65) Prior Publication Data

US 2010/0307997 A1 Dec. 9, 2010

(30) Foreign Application Priority Data

Jun. 4, 2009 (TW) .............................. 98209807 U

(51) Int. Cl.
*F16M 1/00* (2006.01)
(52) U.S. Cl. ........... 248/638; 248/56; 411/352; 411/353
(58) Field of Classification Search .................... 248/56, 248/603, 605, 609, 635, 638; 361/704; 16/2.1; 411/335, 353, 427, 999; 417/363
See application file for complete search history.

(56) References Cited

U.S. PATENT DOCUMENTS

| 4,999,019 | A | * | 3/1991 | Kraus | 411/512 |
| 5,090,644 | A | * | 2/1992 | Lenker | 248/56 |
| 6,174,118 | B1 | * | 1/2001 | Rebers et al. | 411/352 |
| 6,379,093 | B1 | * | 4/2002 | Bondarowicz et al. | 411/353 |
| 7,895,709 | B2 | * | 3/2011 | Shishikura | 16/2.1 |
| 7,990,722 | B2 | * | 8/2011 | Cao et al. | 361/721 |
| 2007/0242433 | A1 | | 10/2007 | Lin et al. | |

* cited by examiner

*Primary Examiner* — Gwendolyn Baxter

(57) ABSTRACT

A mounting rack structure includes a rack body having a plurality of downward extended supporting legs, each of which is provided near a distal end with an mounting hole; a plurality of mounting hole adapters; and a plurality of fastening elements. The mounting hole adapter includes at least one vertical extension portion with a first retaining flange and a central passage having at least one second retaining flange formed therearound; and is assembled to the mounting hole with the first retaining flange firmly pressed against one side of the supporting leg. The fastening element can be extended through the central passage of the mounting hole adapter to firmly lock the supporting leg and accordingly the rack body to a heat-generating unit. With the mounting hole adapter, the mounting rack structure can be used with different types of fastening elements to save the cost for making different molds.

12 Claims, 16 Drawing Sheets

1

MOUNTING RACK STRUCTURE AND MOUNTING HOLE ADAPTER THEREOF

This application claims the priority benefit of Taiwan patent application No. 098209807 filed on Jun. 4, 2009.

FIELD OF THE INVENTION

The present invention relates to a mounting hole adapter, and more particularly to a mounting hole adapter for assembling to a mounting hole on a mounting rack, allowing the mounting rack to be used with different types of fastening elements without the need of making additional molds to produce mounting racks with differently shaped mounting holes.

BACKGROUND OF THE INVENTION

Following the rapid development in the electronic and information industrial fields, all kinds of electronic products, such as computers and notebook computers, have been more widely adopted among users and applied to various fields. For example, among different electronic products, the central processing unit (CPU) of the currently available computers has increased computing and processing speed and expanded access capacity. However, the CPU operating at high speed would also produce a large amount of heat during the operation thereof.

Similarly, when an electronic device operates, internal electronic elements thereof will produce a large amount of heat. Thus, an additional heat dissipating unit is required to enhance heat dissipation of the electronic device, lest the electronic elements thereof should have lowered working efficiency or become damaged due to overheating. The heat dissipating unit is usually a radiating fin assembly or a heat sink with at least one cooling fan assembled thereto, so that the cooling fan produces cooling airflow toward the heat dissipating unit to forcedly carry away the heat transferred to the heat dissipating unit and thereby upgrade the overall heat dissipation performance of the electronic device. The radiating fin assembly or the heat sink is usually firmly connected to the heat-producing electronic elements via a mounting rack to efficiently transfer and dissipate the heat produced by the electronic elements.

FIG. 1A shows a first conventional mounting rack structure 1, which includes a rack body 11 having an upper side 12, to which a cooling fan and/or a radiating fin assembly can be mounted, and a plurality of supporting legs 13 downward extended from four corners of the upper side 12. The supporting legs 13 each have a round mounting hole 14 formed near a distal end thereof, so that a spring screw 15 can be extended through the round mounting hole 14 to engage with a jam nut 16 and therefore be held to the supporting leg 13. The use of the spring screws 15 depends on the actual need in connecting the mounting rack structure 1 to a heat-producing unit.

FIG. 1B shows a second conventional mounting rack structure 2, which includes a rack body 21 having an upper side 22 and a plurality of supporting legs 23 downward extended from four corners of the upper side 22. The supporting legs 23 each have an oblong mounting hole 24 formed near a distal end thereof, so that an upper part 25 and a lower part 26 of a push-type screw assembly can be extended through the oblong mounting hole 24 to engage with each other and therefore be held to the supporting leg 23. The use of the upper and lower parts 25, 26 of a push-type screw assemblies depends on the actual need in connecting the mounting rack structure 2 to a heat-producing unit.

Both of the conventional mounting rack structures 1, 2 can be connected to a circuit board or a backplate of the heat-producing unit. However, the spring screws 15 can only be used with the round mounting holes 14 on the mounting rack structure 1 to lock the supporting legs 13 to the heat-producing unit. When the spring screws 15 are used with the oblong mounting holes 24, the spring screws 15 can not be firmly held in the oblong mounting holes 24. Similarly, the upper and the lower parts 25, 26 of the push-type screw assemblies can not be used with the round mounting holes 14. Therefore, the mounting rack structures 1, 2 are not exchangeable with each other for use. A manufacturer has to expend extra money to make two molds for forming two mounting rack structures having differently shaped mounting holes.

In brief, the conventional mounting rack structures have the following disadvantages: (1) They are not exchangeable for use; and (2) increased cost is required to make molds for forming different mounting rack structures.

It is therefore tried by the inventor to develop a mounting hole adapter for mounting rack structure, so that the same mounting rack can be used with different types of fastening elements and the cost for making additional molds can be saved.

SUMMARY OF THE INVENTION

A primary object of the present invention is to provide a mounting hole adapter for assembling to a mounting hole on a mounting rack, so that the mounting rack can be used with different types of fastening elements.

Another object of the present invention is to provide a mounting rack structure that can be used with different types of fastening elements according to actual need.

A further object of the present invention is to provide a mounting rack structure for use with different types of fastening elements, so as to save the cost of making additional molds for producing mounting racks with differently shaped mounting holes.

To achieve the above and other objects, the mounting hole adapter for mounting rack structure according to the present invention includes a main body having at least one extension portion vertically extended from one of two opposite faces of the main body. The extension portion is provided at a distal end with a radially and horizontally outward extended first retaining flange. The first retaining flange has a free edge formed into a first beveled surface. The main body of the mounting hole adapter is formed at a central position with a central passage and at least one second retaining flange radially extended into the central passage. The second retaining flange has a free edge formed into a second beveled surface. And, a buffer space is formed on the main body at an outer side of each of the extension portion and the second retaining flange.

And, the mounting rack structure according to the present invention includes a rack body, a plurality of mounting hole adapters, and a plurality of fastening elements. The rack body has a support portion, from which a plurality of supporting legs is downward extended, and each of the supporting legs is provided near a distal end with a mounting hole. Each of the mounting hole adapters is assembled to one mounting hole, and the fastening element can be extended through the central passage of the mounting hole adapter. The fastening element has a diameter-reduced section corresponding to the second retaining flange and can therefore be held to the mounting hole adapter and accordingly to the supporting leg of the rack body. Therefore, the mounting rack structure can be locked to a heat-producing unit using different types of fastening ele- 'ments, and the cost of making additional molds to produce mounting racks with different mounting holes can be saved.

In brief, the present invention provides the following advantages: (1) the mounting rack structure can be used with different types of fastening elements; and (2) the cost of making additional molds to produce mounting racks with different mounting holes can be saved.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 2A:
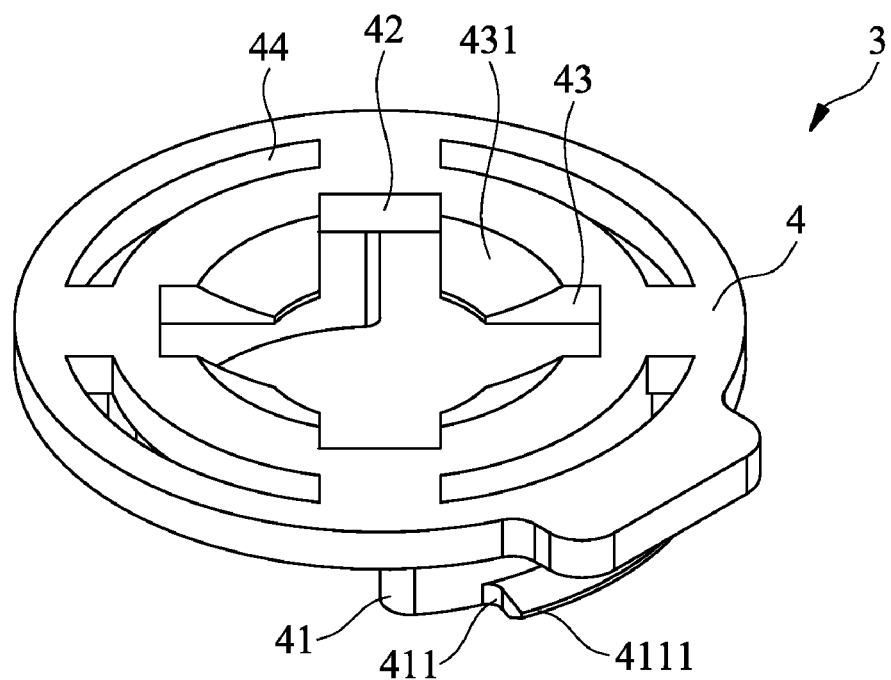
FIG. 2A is a top perspective view of a mounting hole adapter for mounting rack structure according to a first embodiment of the present invention.
Figure 2B:
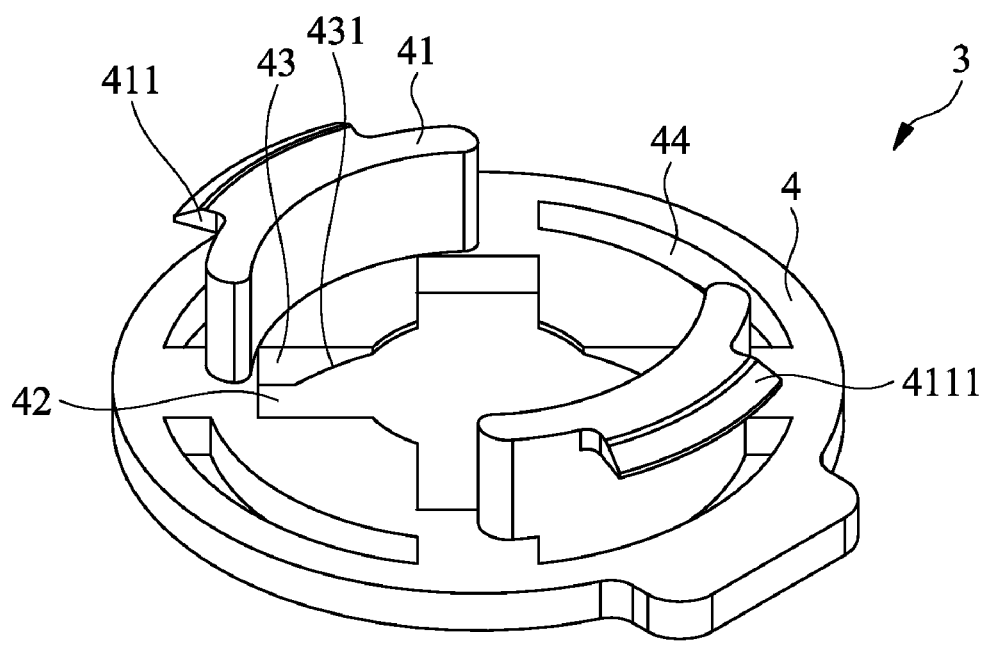
FIG. 2B is a bottom view of FIG. 2A.

Please refer to FIGS. 2A and 2B at the same time, in which a mounting hole adapter 3 for mounting rack structure according to a first embodiment of the present invention is shown. The mounting hole adapter 3 includes a main body 4 having a top and a bottom face. At least one extension portion 41 is vertically downward extended from the bottom face of the main body 4. In the illustrated embodiment, there are shown two diametrically opposite extension portions 41. Each of the extension portions 41 is provided at a distal end with a radially and horizontally outward extended first retaining flange 411. The first retaining flange 411 has a free edge formed into a first beveled surface 4111. The main body 4 of the mounting hole adapter 3 is formed at a central position with a central passage 42 and at least one second retaining flange 43 radially extended into the central passage 42. In the illustrated embodiment, there are formed of four spaced second retaining flanges 43. Each of the second retaining flanges 43 has a free edge formed into a second beveled surface 431. And, a buffer space 44 is formed on the main body 4 at a radially outer side of each of the extension portions 41 and the second retaining flanges 43.

Figure 1A:
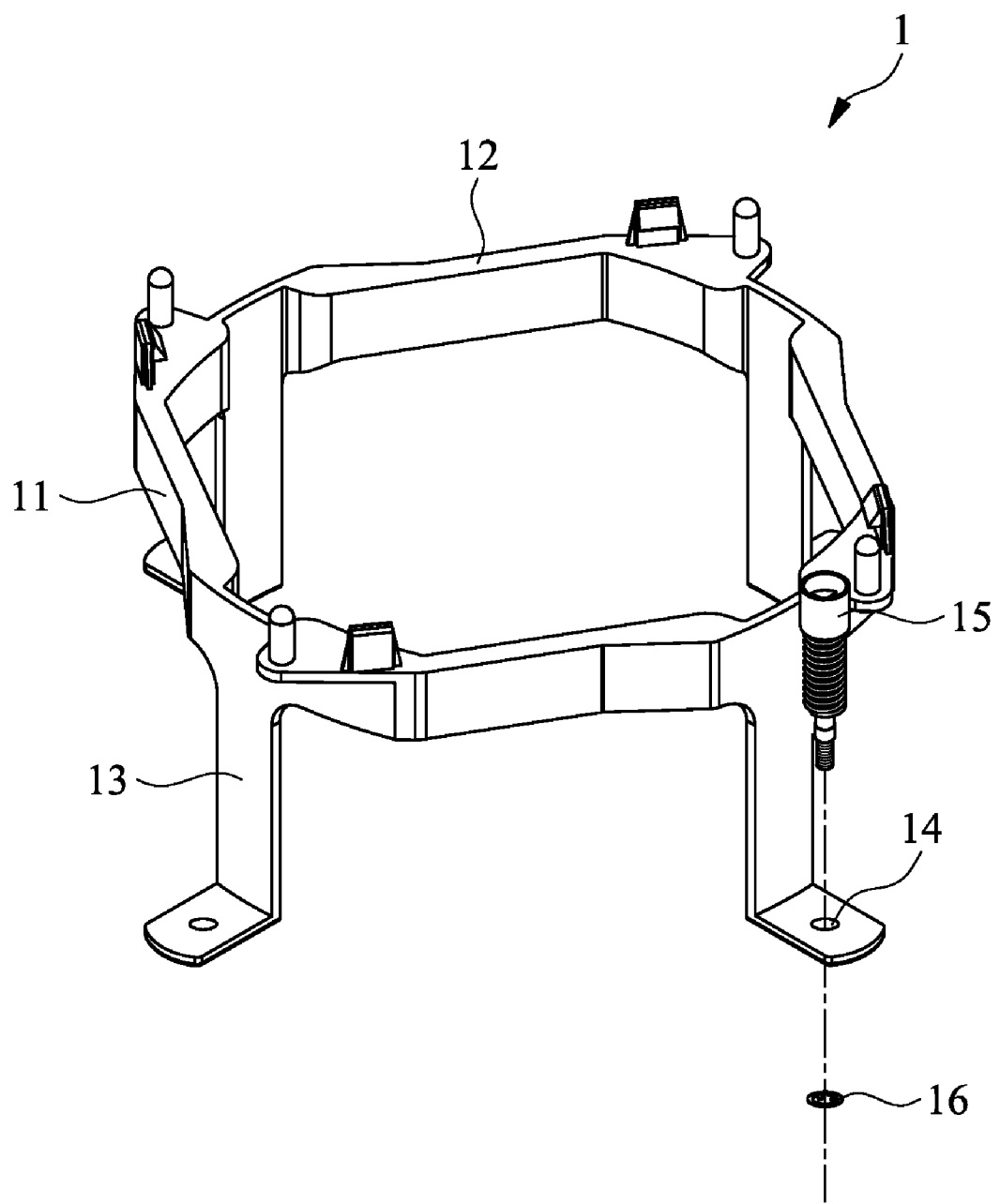
FIG. 1A is an exploded perspective view showing a first conventional mounting rack structure and the fastening elements thereof.
Figure 1B:
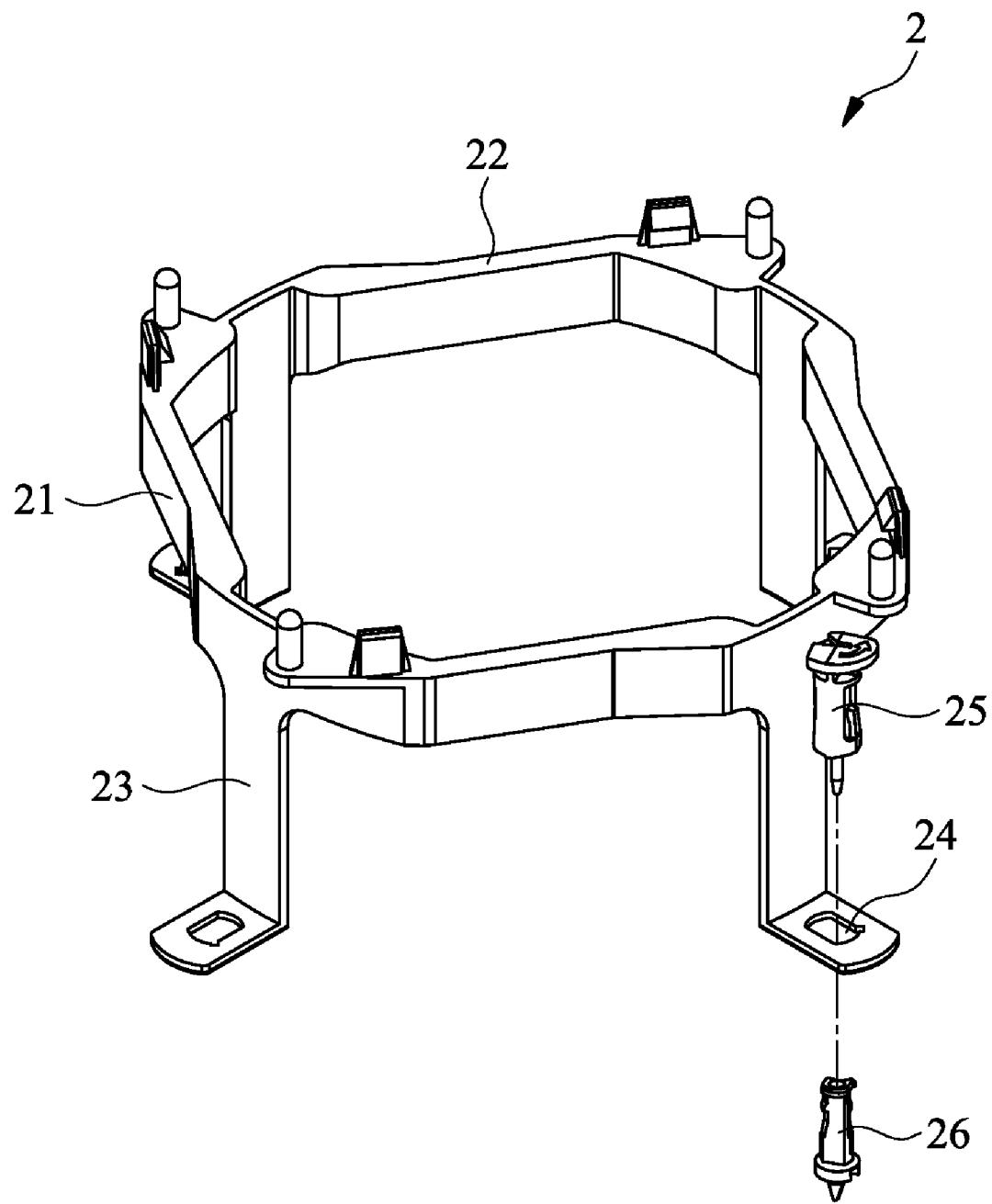
FIG. 1B is an exploded perspective view showing a second conventional mounting rack structure and the fastening elements thereof.
Figure 3:
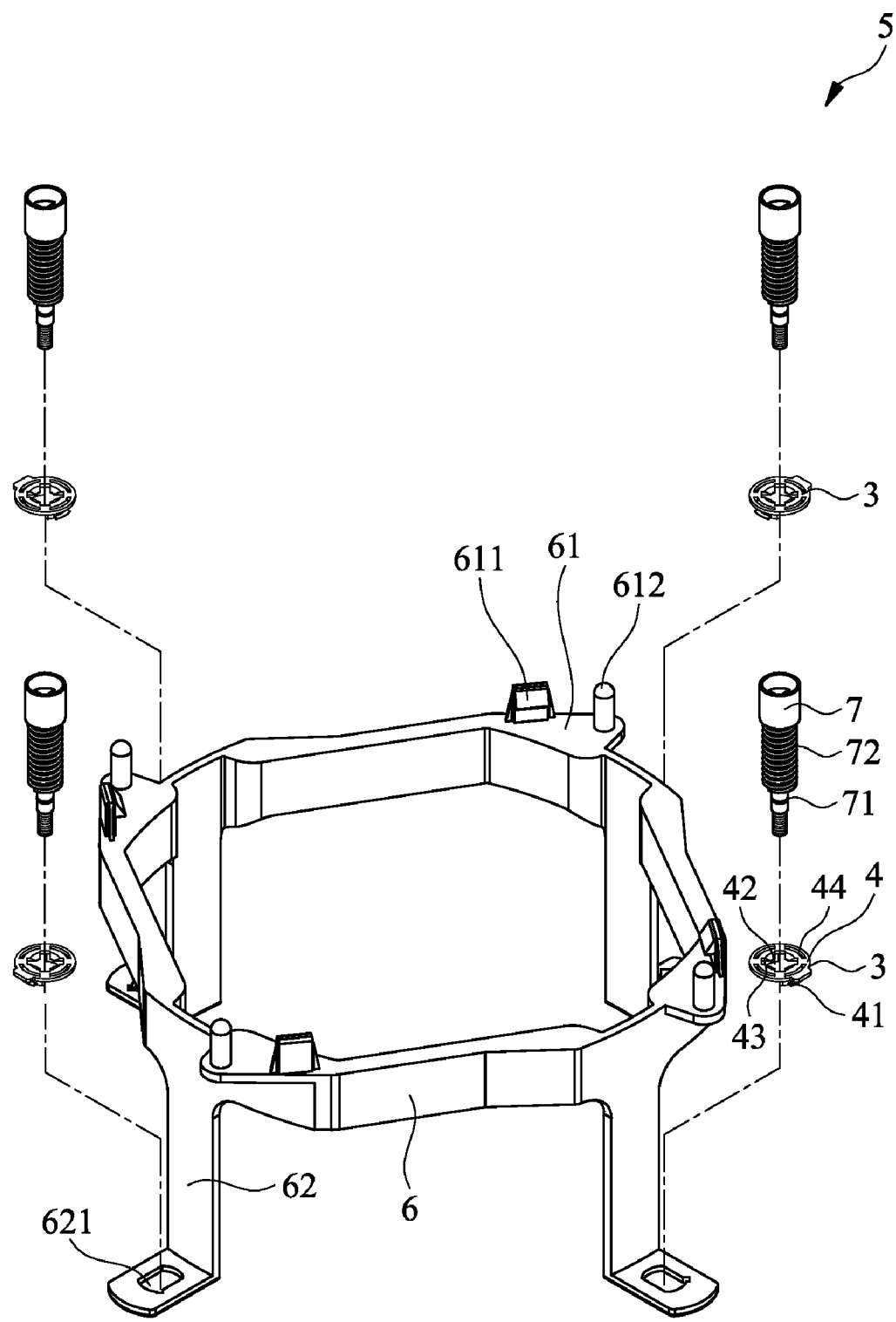
FIG. 3 is an exploded perspective view of a mounting rack structure according to a preferred embodiment of the present invention, with which the mounting hole adapter of FIG. 2A is used.

FIG. 3 is an exploded perspective view of a mounting rack structure 5 according to a preferred embodiment of the present invention, with which the mounting hole adapter 3 can be used. The mounting rack structure 5 includes a rack body 6 and a plurality of fastening elements 7. The rack body 6 has an upper side serving as a support portion 61, to which a cooling fan and/or a heat sink (not shown) can be mounted. A plurality of spaced supporting legs 62 is downward extended from a lower side of the rack body 6. Each of the supporting legs 62 is provided at a distal end thereof with a mounting hole 621. By extending two mating fastening elements, such as the upper and lower parts 25, 26 of the push-type screw assembly as shown in FIG. 1B, directly through each of the mounting holes 621, the rack body 6 can be fixedly connected to a heat-producing unit (not shown). On the other hand, each of the mounting holes 621 can have one of the mounting hole adapters 3 assembled thereto, so that the fastening elements 7 similar to the spring screws shown in FIG. 7A can be extended through the mounting hole adapters 3 to fixedly connect the rack body 6 to the heat-producing product.

Figure 4A:
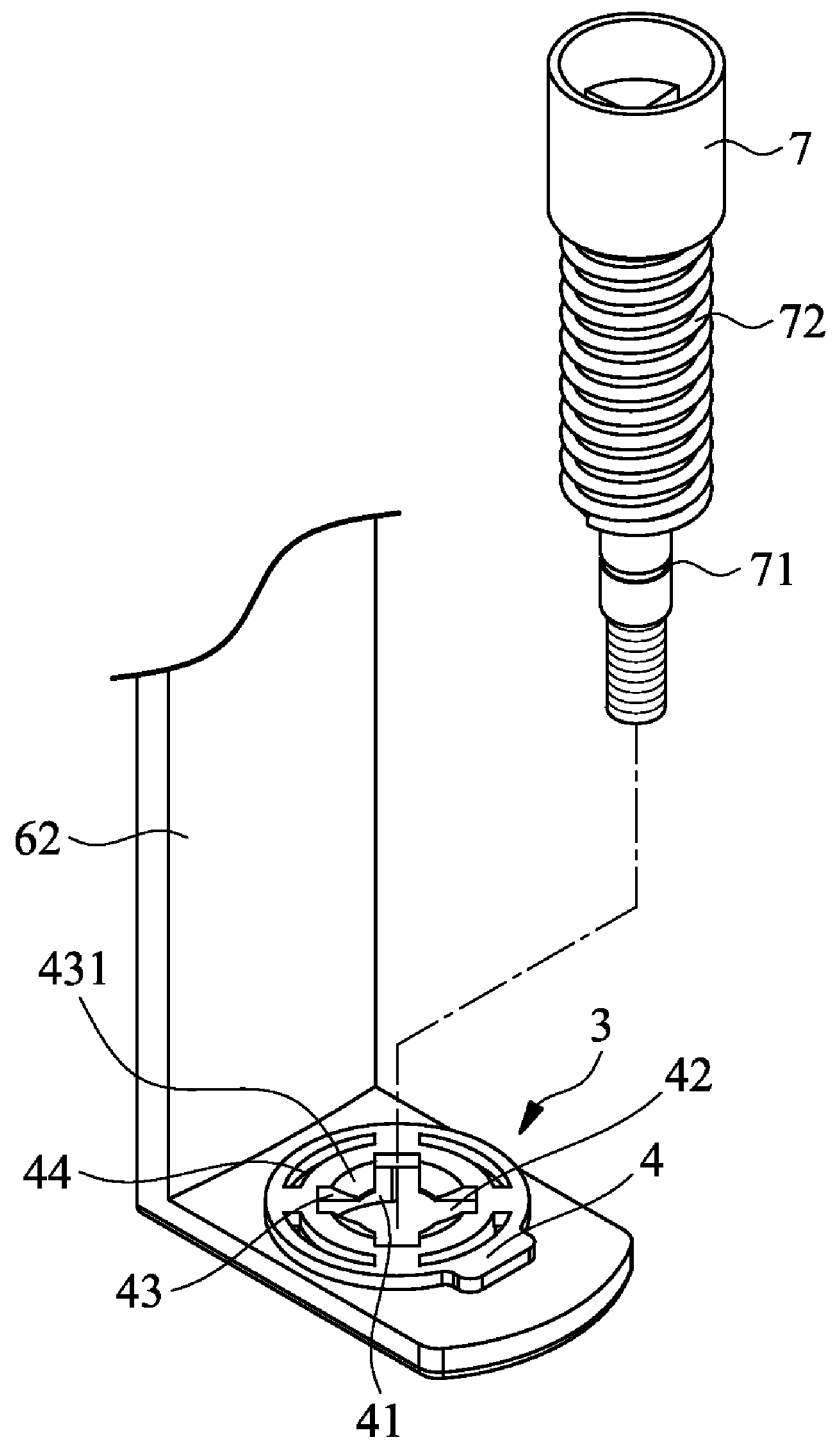
FIGS. 4A and 4B are fragmentary perspective views showing the manner of assembling the mounting hole adapter of FIG. 2A to the mounting rack structure of FIG. 3.
Figure 4B:
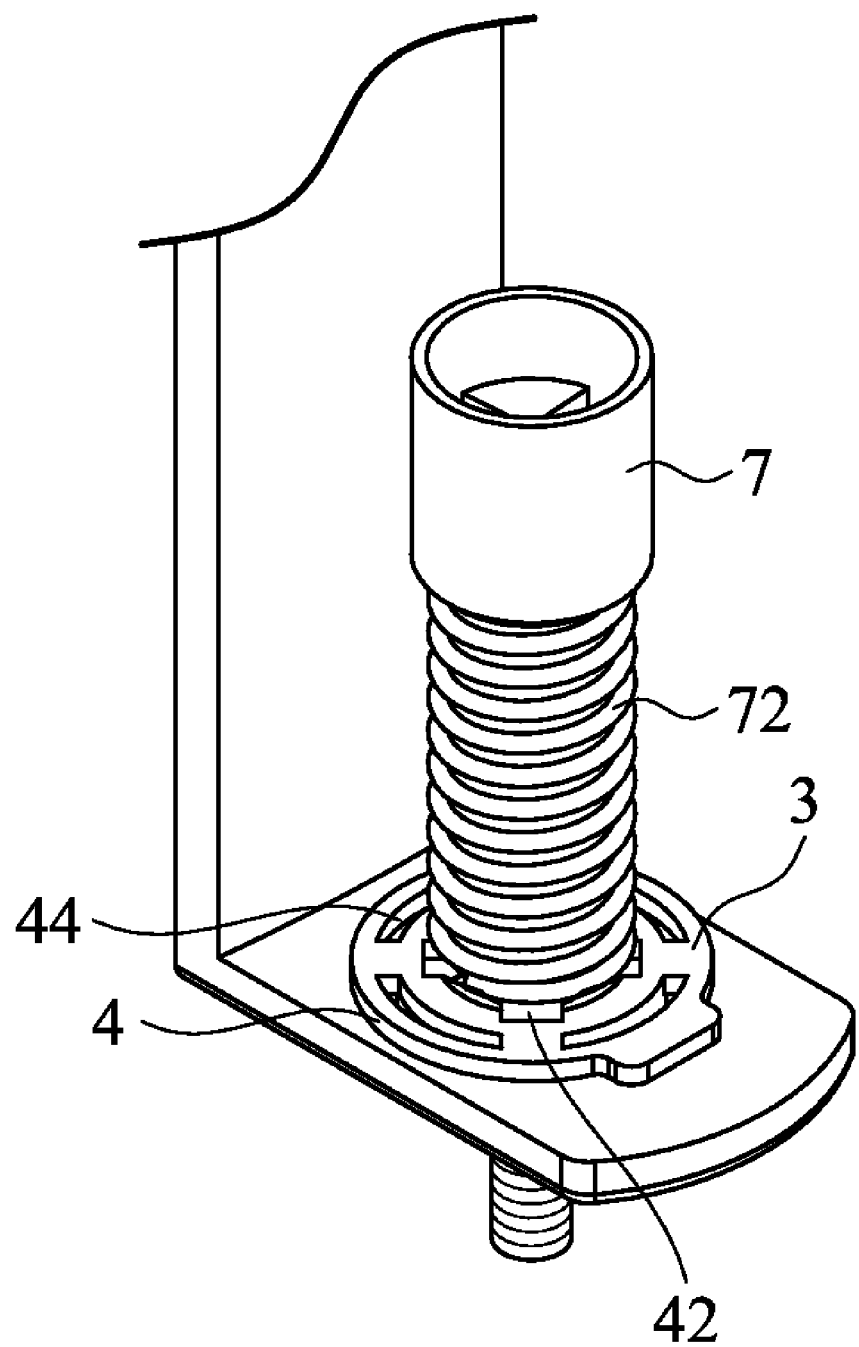
Figure 4C:
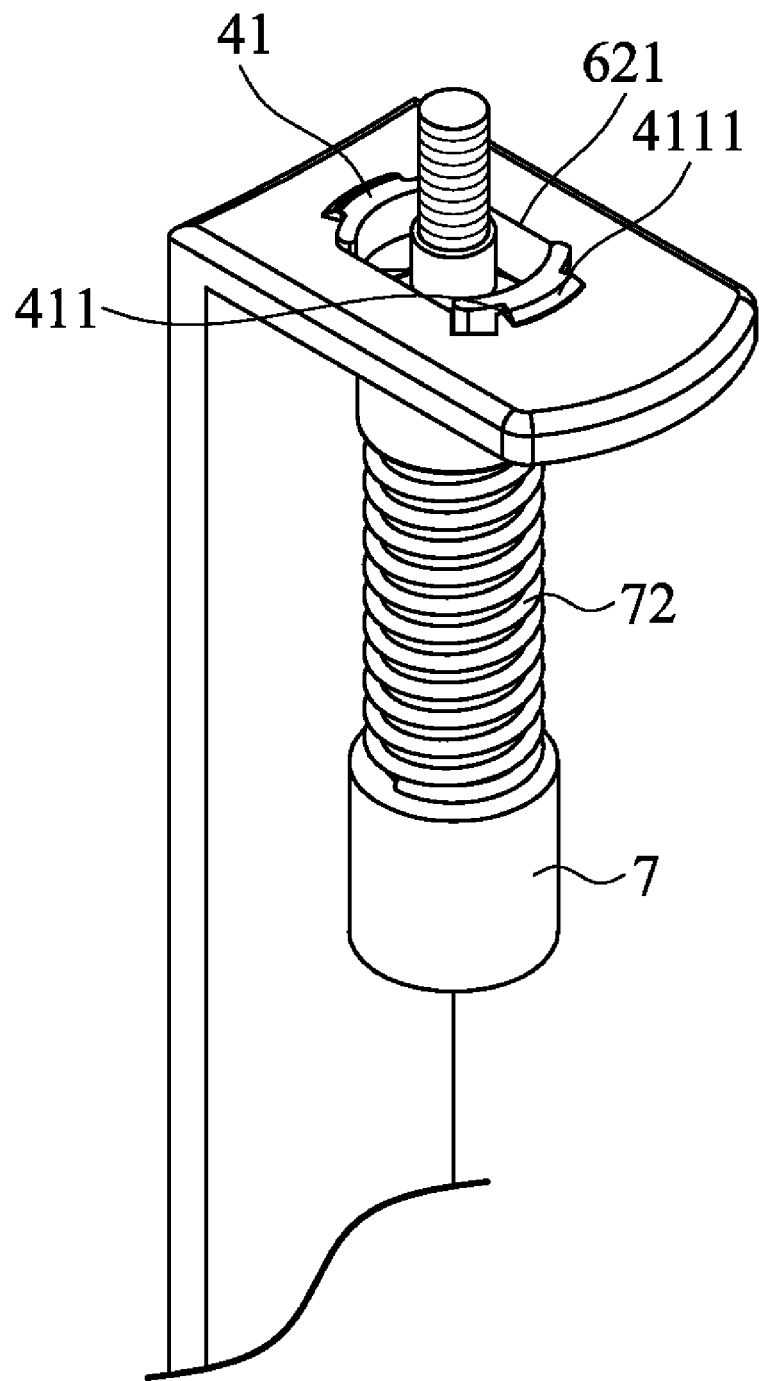
FIG. 4C is a bottom view of FIG. 4B.

Please refer to FIGS. 4A to 4C. To assemble the mounting hole adapter 3 to the mounting hole 621, simply extend the extension portion 41 at the bottom face of the mounting hole adapter 3 down through the mounting hole 621. The first beveled surfaces 4111 on the extension portions 41 facilitate easy movement of the extension portions 41 through the mounting hole 621. Moreover, the buffer spaces 44 provided on the main body 4 allow the extension portions 41 to elastically radially inward retract when the extension portions 41 are moved into the mounting hole 621, and allow the extension portions 41 to elastically restore to respective radially outward position when the extension portions 41 have been fully located in the mounting hole 621. At this point, the first retaining flanges 411 located at the distal ends of the extension portions 41 are pressed against a lower side of the supporting leg 62 surrounding the mounting hole 621 to hold the mounting hole adapter 3 to the mounting hole 621 and accordingly, the supporting leg 62.

After the mounting hole adapter 3 is firmly assembled to the mounting hole 621 on the supporting leg 62, the fastening element 7 can be downward extended from an upper side of the mounting hole 621 through the central passage 42 of the mounting hole adapter 3 to be clamped among the second retaining flanges 43. The second beveled surfaces 431 on the free edge of the second retaining flanges 43 facilitate easy movement of the fastening element 7 into the central passage 42. Further, the buffer spaces 44 located at the outer side of the second retaining flanges 43 allow the second retaining flanges 43 to elastically radially outward retract when the fastening element 7 is moved into the central passage 42, and allow the second retaining flanges 43 to elastically restore to respective radially inward position when a diameter-reduced engaging section 71 on the fastening element 7 is moved through the central passage 42 to locate among the second retaining flanges 431. At this point, the fastening element 7 with an elastic element 72 fitted therearound is held to the mounting hole adapter 3 and accordingly, the mounting hole 621. That is, by providing the mounting hole adapters 3, the mounting rack structure 5 can be connected to a heat-producing unit with different types of fastening elements. Therefore, the cost for making additional molds to produce mounting rack structures with differently shaped mounting holes can be saved.

Figure 5A:
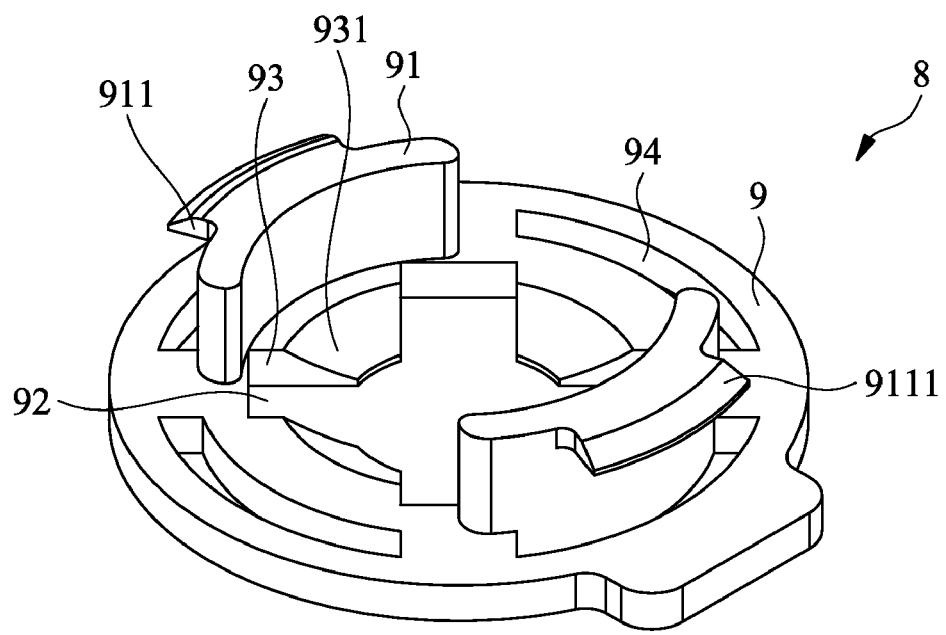
FIG. 5A is a top perspective view of a mounting hole adapter for mounting rack structure according to a second embodiment of the present invention.
Figure 5B:
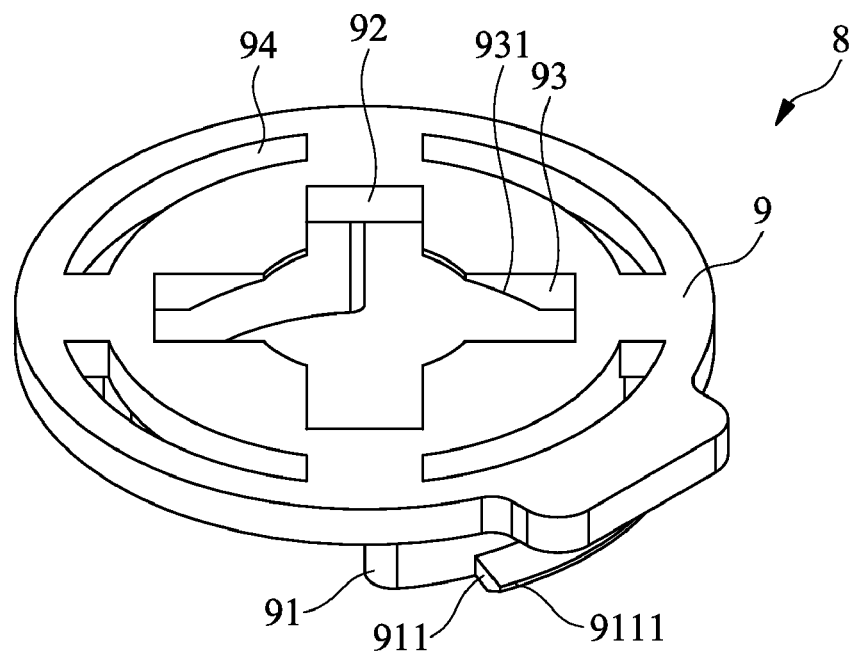
FIG. 5B is a bottom view of FIG. 5A.

Please refer to FIGS. 5A and 5B at the same time, in which a mounting hole adapter 8 for mounting rack structure according to a second embodiment of the present invention is shown. The mounting hole adapter 8 includes a main body 9 having a top and a bottom face. At least one extension portion 91 is vertically upward extended from the top face of the main body 9. In the illustrated embodiment, there are shown two diametrically opposite extension portions 91. Each of the extension portions 91 is provided at a distal end with a radially and horizontally outward extended first retaining flange 911. The first retaining flange 911 has a free edge formed into a first beveled surface 9111. The main body 9 of the mounting hole adapter 8 is formed at a central position with a central passage 92 and at least one second retaining flange 93 radially extended into the central passage 92. In the illustrated embodiment, there are formed of four spaced second retaining flanges 93. Each of the second retaining flanges 93 has a free edge formed into a second beveled surface 931. And, a buffer space 94 is formed on the main body 9 at a radially outer side of each of the extension portions 91 and the second retaining flanges 93.

Figure 6:
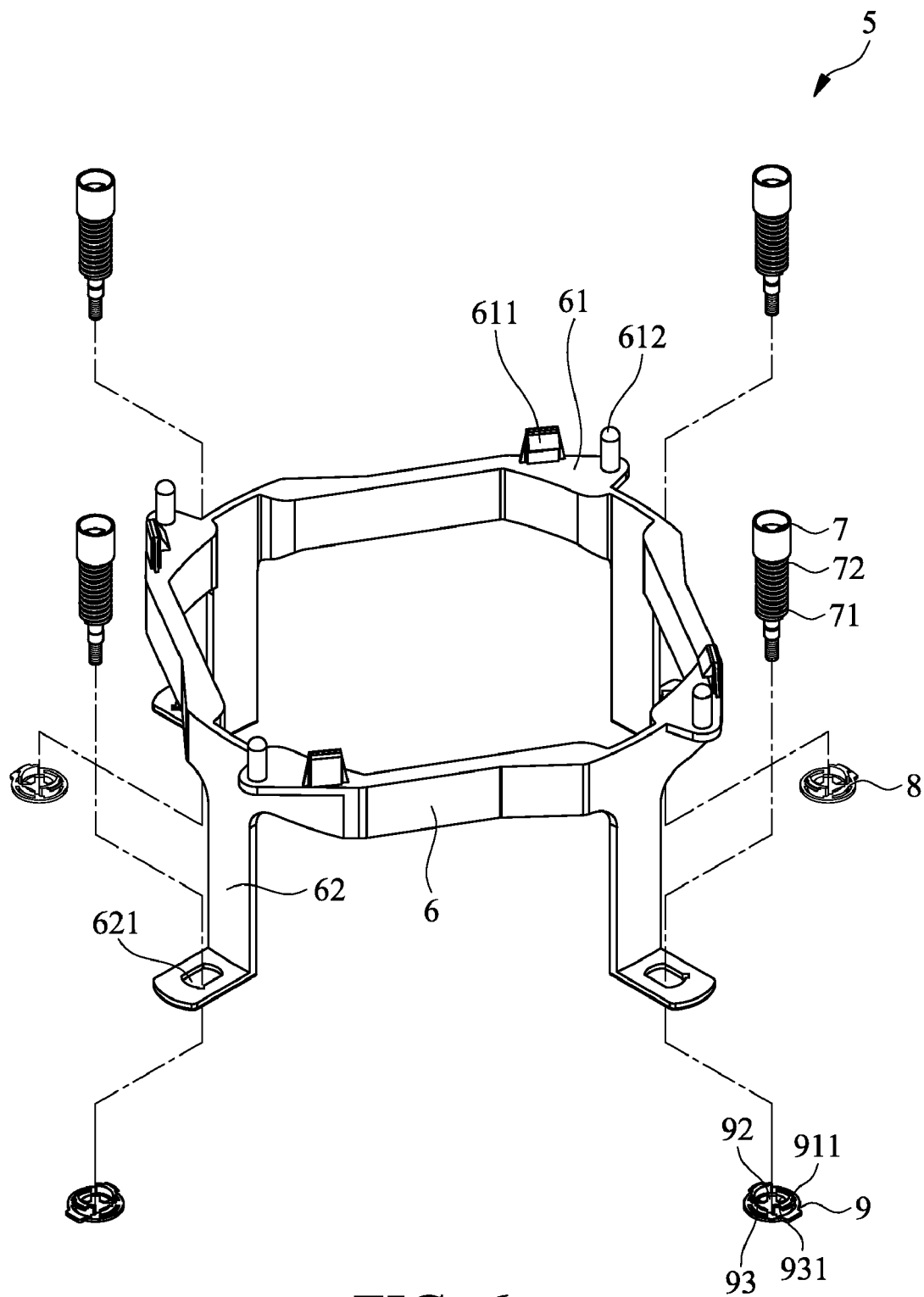
FIG. 6 is an exploded perspective view showing the mounting rack structure according to the preferred embodiment of the present invention used with the mounting hole adapter of FIG. 5A.

FIG. 6 is an exploded perspective view showing the mounting rack structure 5 according to the preferred embodiment of the present invention being used with the mounting hole adapters 8. The mounting rack structure 5 includes a rack body 6 and a plurality of fastening elements 7. The rack body 6 has an upper side serving as a support portion 61, to which a cooling fan and/or a heat sink (not shown) can be mounted. A plurality of spaced supporting legs 62 is downward extended from a lower side of the rack body 6. Each of the supporting legs 62 is provided at a distal end thereof with a mounting hole 621. By extending two mating fastening elements, such as the upper and lower parts 25, 26 of the push-type screw assembly shown in FIG. 1B, directly through each of the mounting holes 621, the rack body 6 can be fixedly connected to a heat-producing product (not shown). On the other hand, each of the mounting holes 621 can have one of the mounting hole adapters 8 assembled thereto, so that the fastening elements 7 similar to the spring screws shown in FIG. 1A can be extended through the mounting hole adapters 8 to fixedly connect the rack body 6 to the heat-producing product.

Figure 7A:
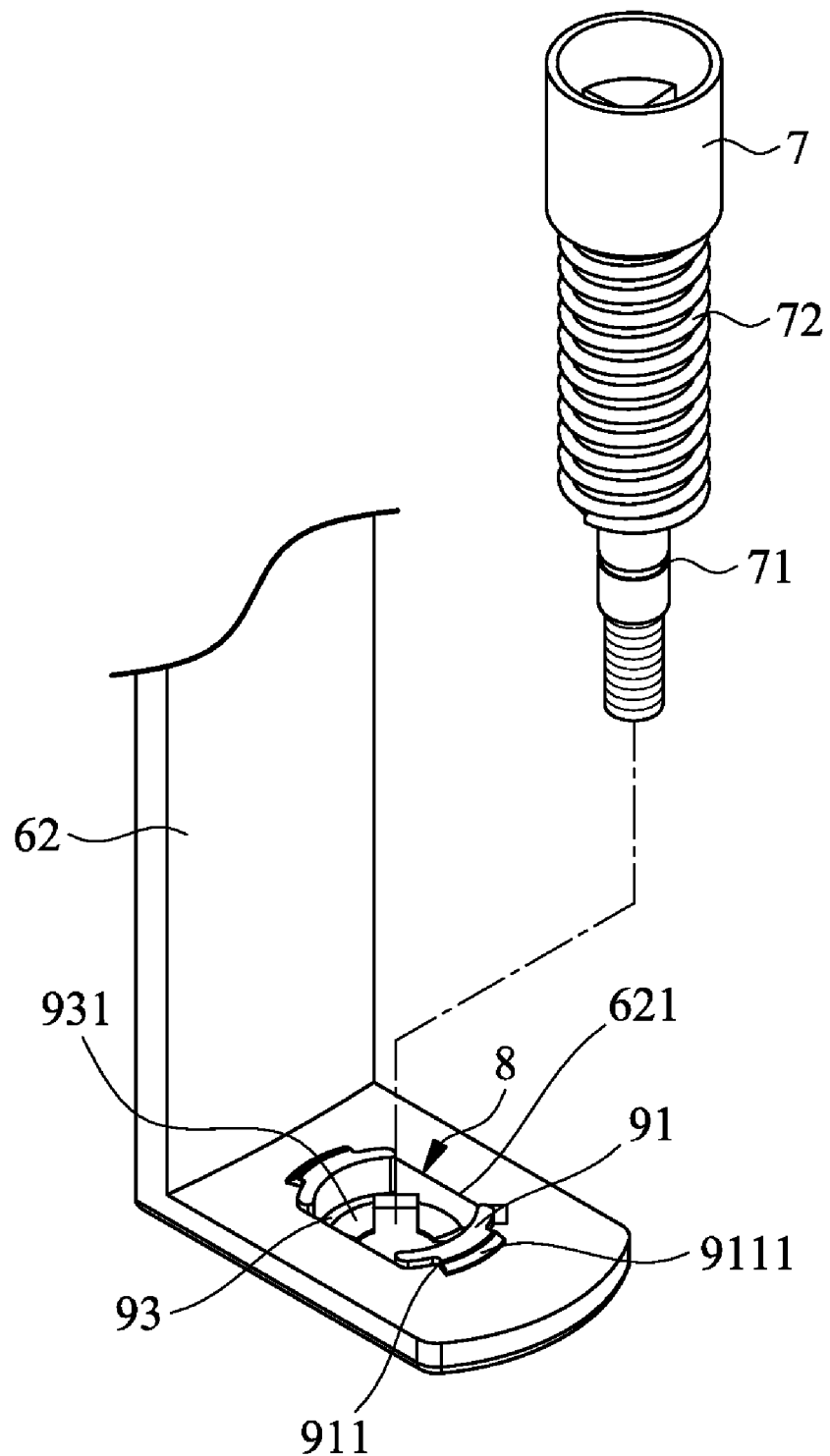
FIGS. 7A and 7B are fragmentary perspective views showing the manner of assembling the mounting hole adapter of FIG. 5A to the mounting rack structure of FIG. 6.
Figure 7B:
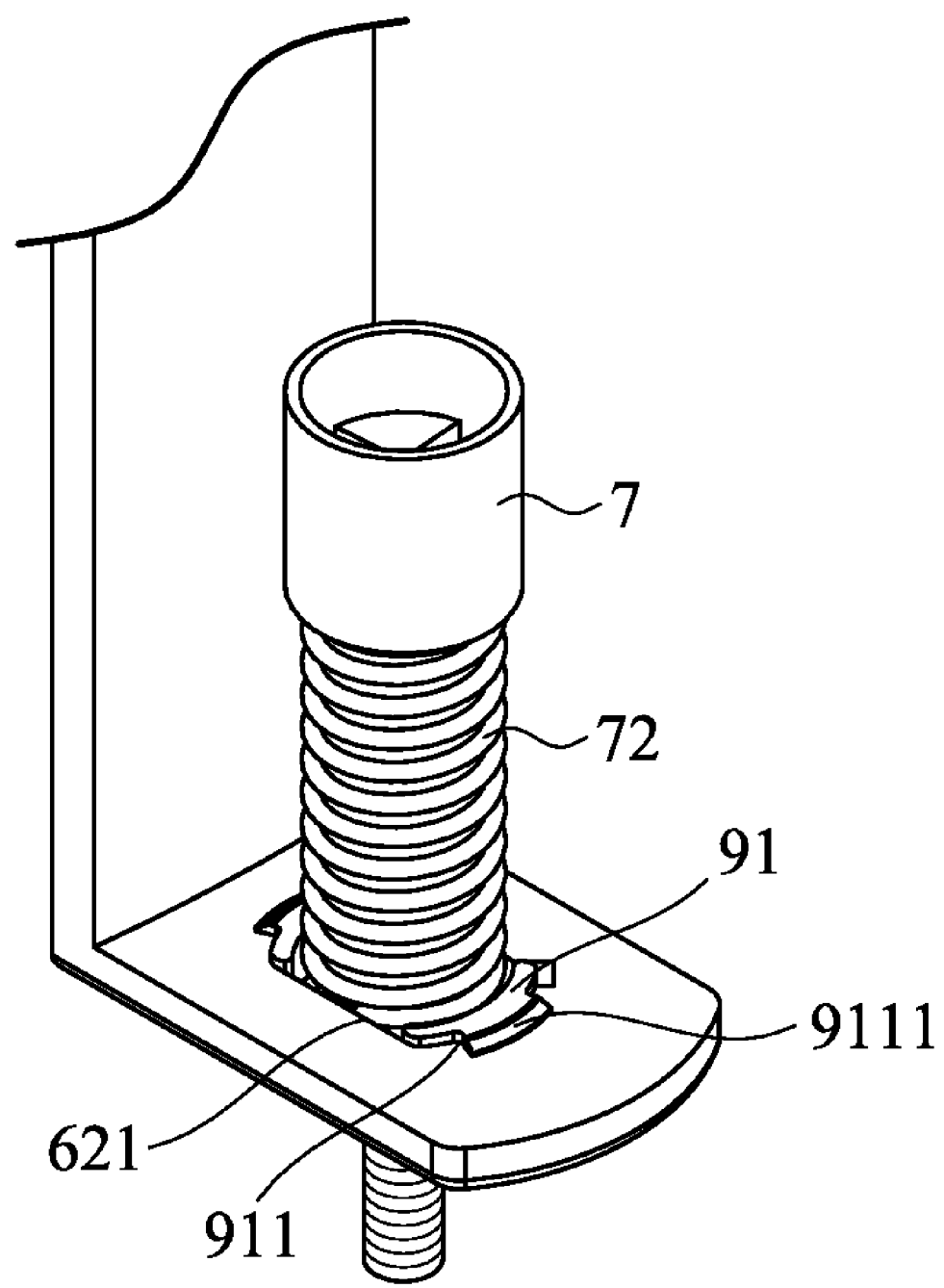
Figure 7C:
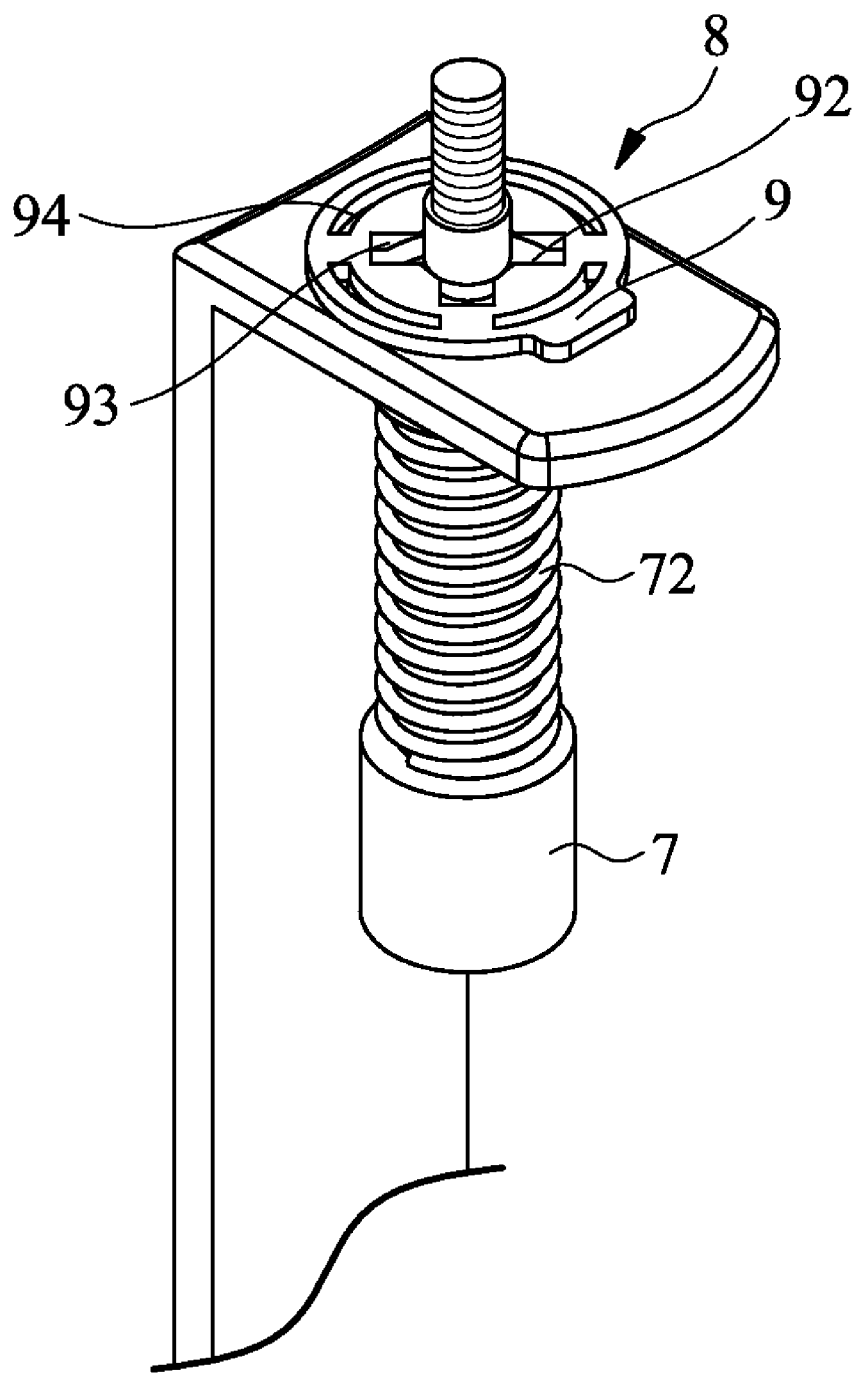
FIG. 7C is a bottom view of FIG. 7B.

Please refer to FIGS. 7A to 7C. To assemble the mounting hole adapter 8 to the mounting hole 621, simply extend the extension portion 91 at the top face of the mounting hole adapter 8 upward through the mounting hole 621. The first beveled surfaces 9111 on the extension portions 91 facilitate easy movement of the extension portions 91 through the mounting hole 621. Moreover, the buffer spaces 94 provided on the main body 9 allow the extension portions 91 to elastically radially inward retract when the extension portions 91 are upward moved into the mounting hole 621, and allow the extension portions 91 to elastically restore to respective radially outward position when the extension portions 91 have been fully located in the mounting hole 621. At this point, the first retaining flanges 911 located at the distal ends of the extension portions 91 are pressed against an upper side of the supporting leg 62 surrounding the mounting hole 621 to hold the mounting hole adapter 8 to the mounting hole 621 and accordingly, the supporting leg 62.

After the mounting hole adapter 8 is firmly assembled to the mounting hole 621 on the supporting leg 62, the fastening element 7 can be downward extended from an upper side of the mounting hole 621 through the central passage 92 of the mounting hole adapter 8 to be clamped among the second retaining flanges 93. The second beveled surfaces 931 on the free edge of the second retaining flanges 93 facilitate easy movement of the fastening element 7 into the central passage 92. Further, the buffer spaces 94 located at the outer side of the second retaining flanges 93 allow the second retaining flanges 93 to elastically radially outward retract when the fastening element 7 is moved into the central passage 92, and allow the second retaining flanges 93 to elastically restore to respective radially inward position when the diameter-reduced engaging section 71 on the fastening element 7 is moved to locate among the second retaining flanges 931. At this point, the fastening element 7 with the elastic element 72 fitted therearound is held to the mounting hole adapter 8 and accordingly, the mounting hole 621. That is, by providing the mounting hole adapters 8, the mounting rack structure 5 can be connected to the heat-producing unit with different types of fastening elements. Therefore, the cost for making additional molds to produce mounting rack structures with differently shaped mounting holes can be saved.

Figure 8A:
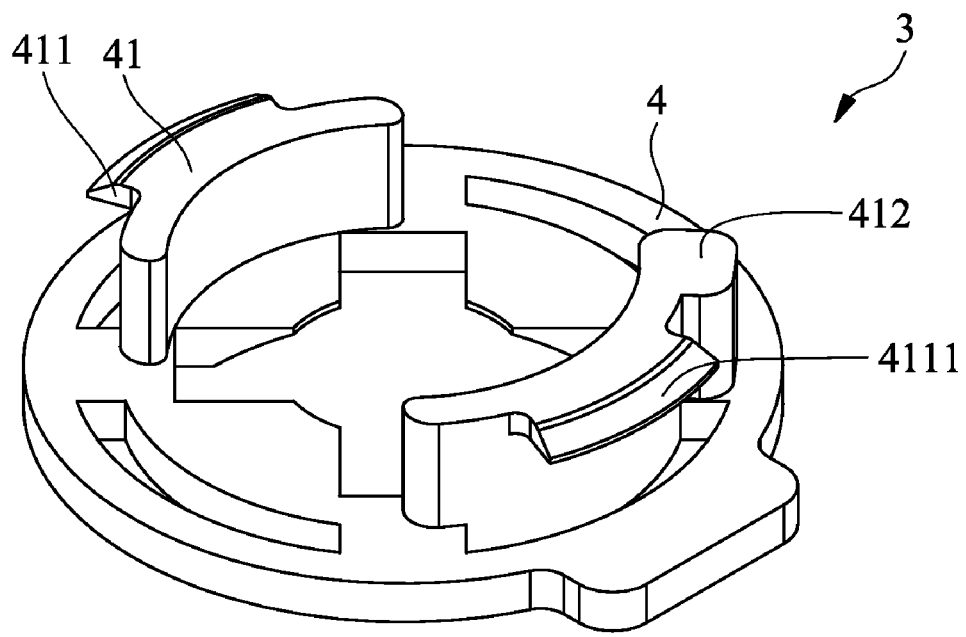
FIG. 8A is a bottom view of a variation of the mounting hole adapter of FIG. 2A.
Figure 8B:
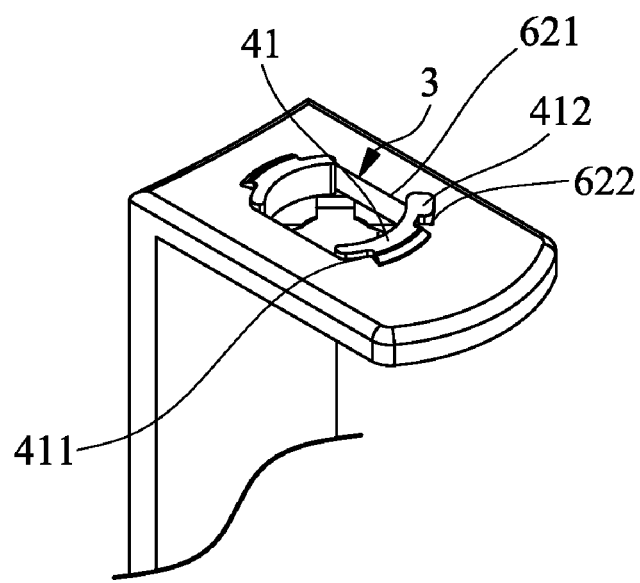
FIG. 8B is a fragmentary bottom perspective view showing the mounting hole adapter of FIG. 8A assembled to the mounting rack structure according to the preferred embodiment of the present invention.

FIG. 8A is a bottom perspective view of a variation of the mounting hole adapter 3, and FIG. 8B is a fragmentary bottom perspective view showing the assembling of the mounting hole adaptor 3 of FIG. 8A to a mounting hole 621. In the variation of FIG. 8A, the mounting hole adapter 3 has a main body 4 having a top and a bottom face. At least one extension portion 41 is vertically downward extended from the bottom face of the main body 4. In the illustrated embodiment, there are shown two diametrically opposite extension portions 41. Each of the extension portions 41 is provided at a distal end with a radially and horizontally outward extended first retaining flange 411. The first retaining flange 411 has a free edge formed into a first beveled surface 4111. At least one of the extension portions 41 is provided with an expanded portion 412 angularly located to one side of the first retaining flange 411. Each of the mounting holes 621 on the rack body 6 of the mounting rack structure 5 is provided at a predetermined position with an outward extended locating slot 622 for engaging with and accordingly holding the upper and lower parts 25, 26 of the push-type screw assembly (see FIG. 1B) in place in the mounting hole 621. When the mounting hole adapter 3 of FIG. 8A is assembled to the mounting hole 621, the expanded portion 412 can be correspondingly inserted in the locating slot 622 to thereby more firmly hold the mounting hole adapter 3 in place in the mounting hole 621.

Figure 8C:
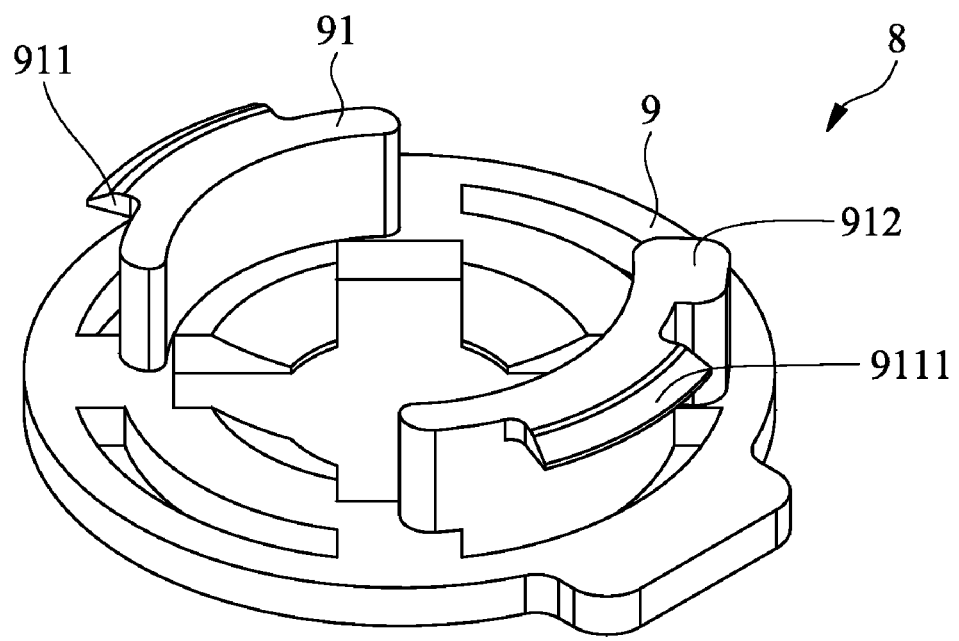
FIG. 8C is a top view of a variation of the mounting hole adapter of FIG. 5A.
Figure 8D:
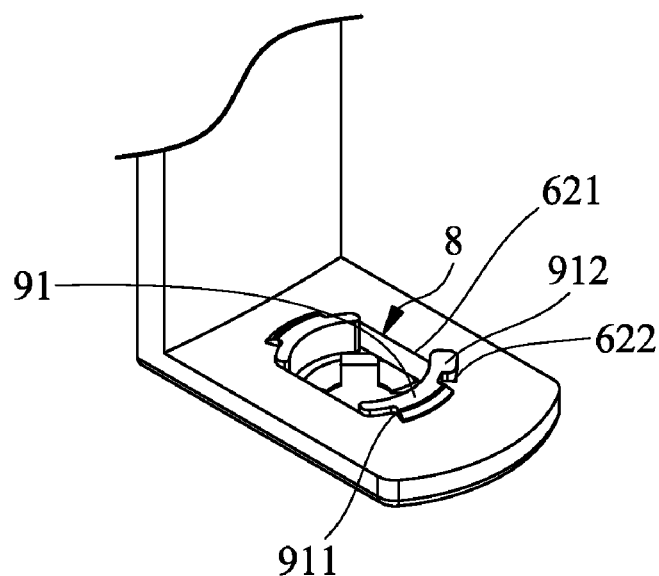
FIG. 8D is a fragmentary top perspective view showing the mounting hole adapter of FIG. 8C assembled to the mounting rack structure according to the preferred embodiment of the present invention.

FIG. 8C is a top perspective view of a variation of the mounting hole adapter 8, and FIG. 8D is a fragmentary top perspective view showing the assembling of the mounting hole adaptor 8 of FIG. 8C to a mounting hole 621. In the variation of FIG. 8C, the mounting hole adapter 8 has a main body 9 having a top and a bottom face. At least one extension portion 91 is vertically downward extended from the top face of the main body 9. In the illustrated embodiment, there are shown two diametrically opposite extension portions 91. Each of the extension portions 91 is provided at a distal end with a radially and horizontally outward extended first retaining flange 911. The first retaining flange 911 has a free edge formed into a first beveled surface 9111. At least one of the extension portions 91 is provided with an expanded portion 912 angularly located to one side of the first retaining flange 911. When the mounting hole adapter 8 of FIG. 8C is assembled to the mounting hole 621, the expanded portion 912 can be correspondingly inserted in the locating slot 622 to thereby more firmly hold the mounting hole adapter 8 in place in the mounting hole 621.

Figure 9A:
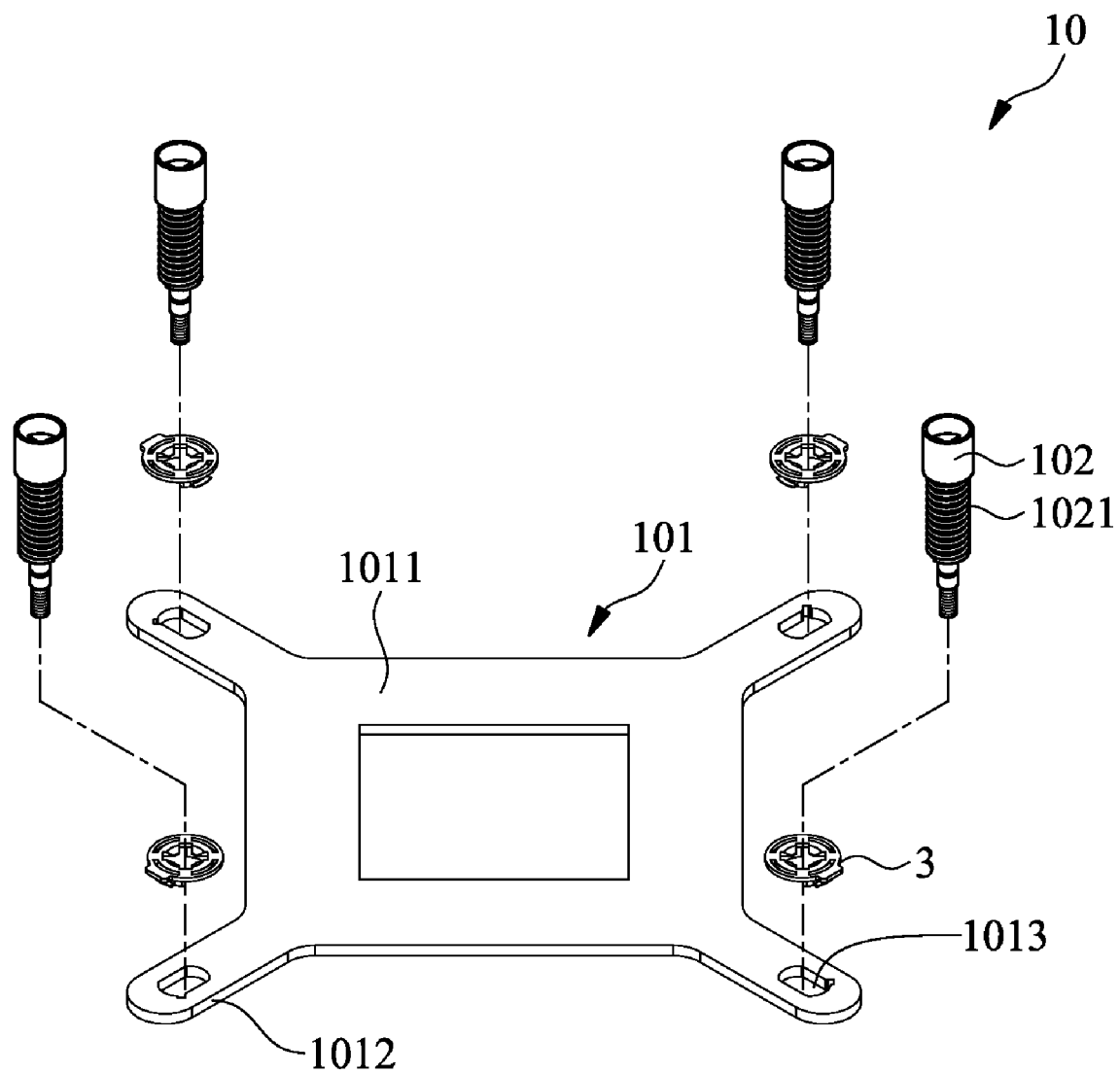
FIG. 9A is a perspective view of a mounting rack structure according to another embodiment of the present invention.
Figure 9B:
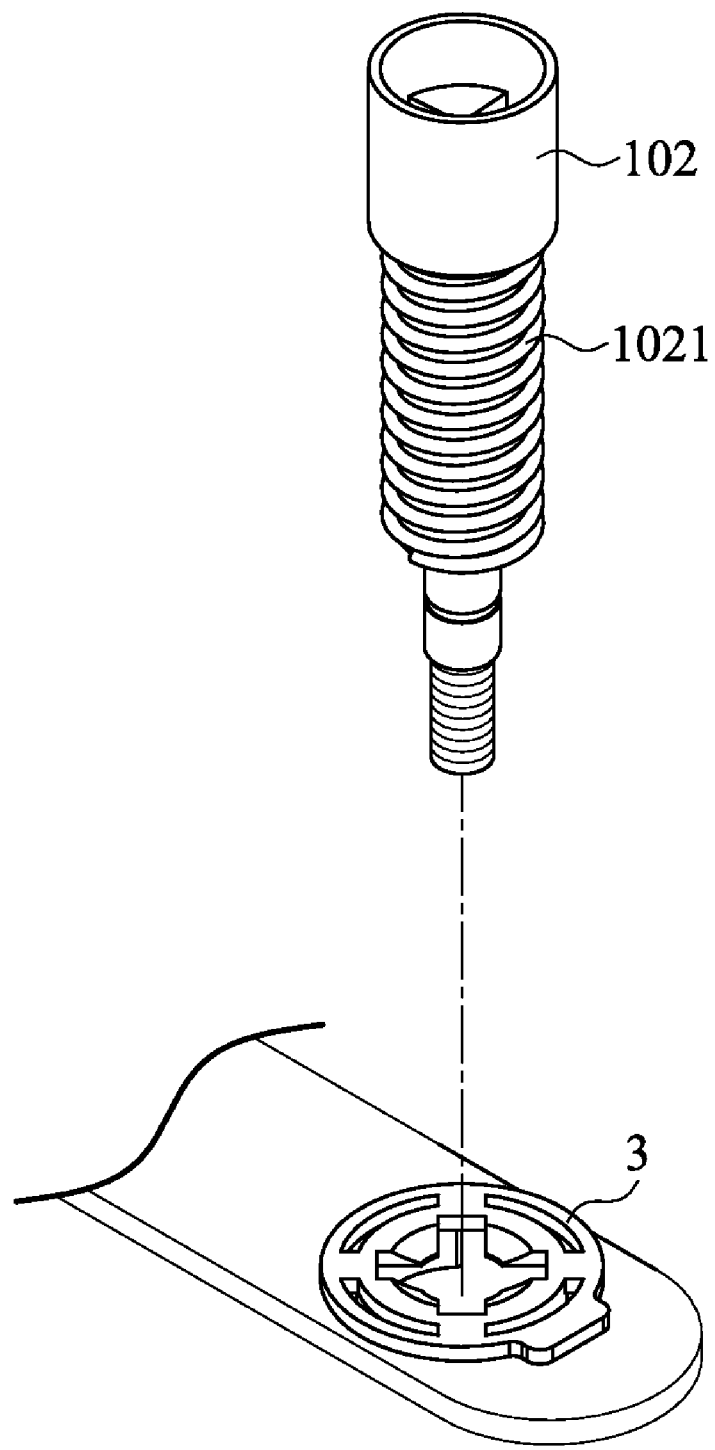
FIG. 9B is a fragmentary top perspective view showing the assembling of the mounting hole adapter of FIG. 2A to the mounting rack structure of FIG. 9A.

FIG. 9A is a perspective view of a mounting rack structure 10 according to another embodiment of the present invention; and FIG. 9B is a fragmentary top perspective view showing the assembling of the mounting hole adapter 3 of FIG. 2A to the mounting rack structure 10 of FIG. 9A. The mounting rack structure 10 is configured as a horizontally extended backplate-type mounting rack, and includes a rack body 101 and a plurality of fastening elements 102. The rack body 101 has an upper side serving as a support portion 1011, and a plurality of supporting legs 1012 horizontally and radially outward extended from the rack body 101. In the embodiment illustrated in FIG. 9A, there are provided four supporting legs 1012. Each of the supporting legs 1012 is provided near a distal end with a mounting hole 1013. The mounting hole adapter 3 can be assembled to each of the mounting holes 1013 and accordingly the supporting legs 1012. With the mounting hole adapters 3 assembled to the mounting holes 1013, each of the fastening elements 102 can be separately downward extended through the mounting hole adapter 3, so that the fastening element 102 with an elastic element 1021 fitted therearound is held to the mounting hole adapter 3. Therefore, by providing the mounting hole adapters 3, the mounting rack structure 10 can be firmly connected to a heat-producing unit with different types of fastening elements, and the cost for making additional molds to produce mounting rack structures 10 with differently shaped mounting holes can be saved.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A mounting rack structure, comprising:
a rack body having a support portion, and a plurality of spaced supporting legs extended from the support portion in predetermined directions; each of the supporting legs being provided near a distal end thereof with a mounting hole;
a mounting hole adapter for assembling to each of the mounting holes provided near the distal ends of the supporting legs; the mounting hole adapter including a main body having at least one extension portion vertically extended from one of two opposite faces of the main body, each of the extension portions being provided at a distal end with a radially and horizontally outward extended first retaining flange; and the main body defining a central passage and having at least one second retaining flange located in the central passage; the extension portion being able to extend through the mounting hole on the supporting leg with the first retaining flange firmly pressing against one face of the supporting leg surrounding the mounting hole; and
a fastening element for extending through each of the mounting hole adapters, the fastening element including a diameter-reduced section corresponding to the at least one second retaining flange, so that the fastening element is held to the mounting hole adapter through engagement of the diameter-reduced section with the second retaining flange, and can therefore be assembled to the supporting leg via the mounting hole adapter.

2. The mounting rack structure as claimed in claim 1, wherein the mounting hole adapter is downward extended through the mounting hole from an upper side thereof, and the at least one extension portion is downward extended into the mounting hole with the first retaining flange firmly pressed against a lower face of the supporting leg surrounding the mounting hole.

3. The mounting rack structure as claimed in claim 1, wherein the mounting hole adapter is upward extended through the mounting hole from a lower side thereof, and the at least one extension portion is upward extended into the mounting hole with the first retaining flange firmly pressed against an upper face of the supporting leg surrounding the mounting hole.

4. The mounting rack structure as claimed in claim 1, wherein the fastening element includes an elastic element fitted therearound.

5. The mounting rack structure as claimed in claim 1, wherein the at least one extension portion is located at a radially outer side of the at least one second retaining flange.

6. The mounting rack structure as claimed in claim 1, wherein the at least one second retaining flange is radially extended into the central passage.

7. The mounting rack structure as claimed in claim 1, wherein the main body of the mounting hole adapter further includes at least one buffer space formed at a radially outer side of the at least one extension portion and the at least one second retaining flange.

8. The mounting rack structure as claimed in claim 1, wherein the first retaining flange has a free edge formed into a first beveled surface.

9. The mounting rack structure as claimed in claim 1, wherein the second retaining flange has a free edge formed into a second beveled surface.

10. The mounting rack structure as claimed in claim 1, wherein the fastening element is a spring screw.

11. The mounting rack structure as claimed in claim 1, wherein the at least one extension portion is provided with an expanded portion angularly located to one side of the first retaining flange.

12. The mounting rack structure as claimed in claim 11, wherein the mounting hole on each of the supporting legs is provided at a predetermined position with an outward extended locating slot, and the expanded portion on the extension portion being correspondingly inserted into the locating slot to thereby firmly hold the mounting hole adapter in place in the mounting hole.

* * * * *